(12) United States Patent
Chen

(10) Patent No.: US 12,224,274 B2
(45) Date of Patent: Feb. 11, 2025

(54) MICRO LIGHT-EMITTING DIODE DISPLAY PANEL AND MANUFACTURING METHOD THEREFOR

(71) Applicant: BOE TECHNOLOGY GROUP CO., LTD., Beijing (CN)

(72) Inventor: Yuju Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 405 days.

(21) Appl. No.: 17/763,645

(22) PCT Filed: Mar. 17, 2021

(86) PCT No.: PCT/CN2021/081368
§ 371 (c)(1),
(2) Date: Mar. 24, 2022

(87) PCT Pub. No.: WO2021/185289
PCT Pub. Date: Sep. 23, 2021

(65) Prior Publication Data
US 2022/0344315 A1   Oct. 27, 2022

(30) Foreign Application Priority Data
Mar. 20, 2020   (CN) .......................... 202010202937.2

(51) Int. Cl.
*H01L 25/16*     (2023.01)
*H01L 23/00*     (2006.01)
(Continued)

(52) U.S. Cl.
CPC ............ *H01L 25/167* (2013.01); *H01L 24/95* (2013.01); *H01L 33/0093* (2020.05);
(Continued)

(58) Field of Classification Search
CPC ... H01L 25/167; H01L 24/95; H01L 33/0093; H01L 33/20; H01L 33/38; H01L 24/05;
(Continued)

(56) References Cited

U.S. PATENT DOCUMENTS 10,319,697 B2 *   6/2019   Zou ..................... H01L 21/561
10,396,237 B2 *   8/2019   Wang ................. H01L 33/0093
(Continued)

FOREIGN PATENT DOCUMENTS

CN       103887387 A  *   6/2014   ............ F21S 41/141
CN       105493297 A       4/2016
(Continued)

*Primary Examiner* — Kyoung Lee
*Assistant Examiner* — Sophia W Kao
(74) *Attorney, Agent, or Firm* — IP & T GROUP LLP

(57) ABSTRACT

A manufacturing method for a micro light-emitting diode (LED) display panel includes: providing a base substrate carrying a plurality of LED dies, each LED die including a first semiconductor layer, a light-emitting material layer, a second semiconductor layer and a first conductive layer, the first semiconductor layer being bonded with the base substrate through a sacrificial layer, a material of the sacrificial layer being decomposable under laser irradiation; providing a backplane having a plurality of bonding structures; bonding at least some LED dies of the plurality of LED dies to at least some of the plurality of bonding structures through respective first conductive layers; and peeling each of the at least some LED dies from the base substrate through laser lift-off.

13 Claims, 9 Drawing Sheets

(51) Int. Cl.
*H01L 33/00* (2010.01)
*H01L 33/20* (2010.01)
*H01L 33/32* (2010.01)
*H01L 33/38* (2010.01)

(52) U.S. Cl.
CPC .............. *H01L 33/20* (2013.01); *H01L 33/38* (2013.01); *H01L 24/05* (2013.01); *H01L 24/08* (2013.01); *H01L 24/80* (2013.01); *H01L 33/007* (2013.01); *H01L 33/32* (2013.01); *H01L 2224/05583* (2013.01); *H01L 2224/05624* (2013.01); *H01L 2224/05644* (2013.01); *H01L 2224/05666* (2013.01); *H01L 2224/08145* (2013.01); *H01L 2224/08502* (2013.01); *H01L 2224/80805* (2013.01); *H01L 2224/95001* (2013.01); *H01L 2924/12041* (2013.01); *H01L 2933/0066* (2013.01)

(58) Field of Classification Search
CPC ....... H01L 24/08; H01L 24/80; H01L 33/007; H01L 33/32; H01L 2224/05583
See application file for complete search history.

(56) References Cited

U.S. PATENT DOCUMENTS

| | | | | |
|---|---|---|---|---|
| 10,896,927 | B2 * | 1/2021 | Zou | .......................... H01L 33/62 |
| 10,971,890 | B2 * | 4/2021 | Zou | ...................... H01S 5/04256 |
| 11,289,634 | B2 * | 3/2022 | Iguchi | ...................... H01L 33/52 |
| 11,387,384 | B2 * | 7/2022 | Park | .......................... H01L 33/24 |
| 11,508,708 | B2 * | 11/2022 | Onuma | .......................... H01L 25/18 |
| 2013/0285086 | A1 | 10/2013 | Hu et al. | |
| 2014/0312319 | A1 | 10/2014 | Kim | |
| 2015/0162496 | A1 * | 6/2015 | Chen | .................. H01L 33/0093 438/29 |
| 2017/0338199 | A1 | 11/2017 | Zou et al. | |
| 2018/0219123 | A1 | 8/2018 | Wang et al. | |
| 2019/0267426 | A1 * | 8/2019 | Zou | .......................... H01L 27/153 |
| 2021/0066138 | A1 * | 3/2021 | Mizumura | ............ H01L 21/268 |

FOREIGN PATENT DOCUMENTS

| | | | | |
|---|---|---|---|---|
| CN | 105870265 A | 8/2016 | | |
| CN | 109148652 A | 1/2019 | | |
| CN | 110707119 A | 1/2020 | | |
| CN | 110707119 B | * 4/2022 | ........... H01L 27/156 |

* cited by examiner

MICRO LIGHT-EMITTING DIODE DISPLAY PANEL AND MANUFACTURING METHOD THEREFOR

CROSS-REFERENCE TO RELATED APPLICATIONS

This application is a national phase entry under 35 USC 371 of International Patent Application No. PCT/CN2021/081368 filed on Mar. 17, 2021, which claims priority to Chinese Application No. 202010202937.2, filed to the Chinese Patent Office on Mar. 20, 2020, which are incorporated herein by reference in their entirety.

TECHNICAL FIELD

The present disclosure relates to the field of display technologies, and in particular, to a micro light-emitting diode display panel and a manufacturing method therefor.

BACKGROUND

In a manufacturing process of a micro light-emitting diode (micro LED) display panel, a mass transfer is usually required after an epitaxial process is completed.

The mass transfer refers to a process of transferring millions or even tens of millions of micron-level LED dies to a circuit substrate accurately and quickly. Considering a 4K tri-color display (an ultra-high definition (UHD) television with a display screen resolution of 3840×2160 and above, and the resolution thereof being eight times that of a high definition (HD) television and four times that of a full high definition (FHD) television) as an example, the number of LED dies that need to be transferred is as high as 24 million (4000×2000×3), and even if 10,000 LED dies are transferred at a single time, this process needs to be repeated 2400 times.

Among mass transfer technologies in related art, the laser transfer is welcomed in the industry due to its advantages such as high reliability, high yield, high scalability, high selectivity and high success rate.

SUMMARY

In an aspect, embodiments of the present disclosure provide a manufacturing method for a micro light-emitting diode display panel. The manufacturing method includes:

providing a base substrate carrying a plurality of light-emitting diode dies, each light-emitting diode die including a first semiconductor layer, a light-emitting material layer, a second semiconductor layer and a first conductive layer that are formed on the base substrate and sequentially arranged in a direction away from the base substrate, the first semiconductor layer being bonded with the base substrate through a sacrificial layer, a material of the sacrificial layer being decomposable under laser irradiation;

providing a backplane having a plurality of bonding structures;

bonding at least some light-emitting diode dies of the plurality of light-emitting diode dies to at least some of the plurality of bonding structures through respective first conductive layers; and peeling each of the at least some light-emitting diode dies from the base substrate through laser lift-off.

In some embodiments, peeling each of the at least some light-emitting diode dies from the base substrate through the laser lift-off includes:

performing laser ablation on the sacrificial layer corresponding to each of the at least some light-emitting diode dies to separate the at least some light-emitting diode dies from the base substrate.

In some embodiments, performing the laser ablation corresponding to the sacrificial layer on each of the at least some light-emitting diode dies to separate the at least some light-emitting diode dies from the base substrate includes:

covering remaining light-emitting diode dies of the plurality of light-emitting diode dies other than the at least some light-emitting diode dies; and irradiating each of the at least some light-emitting diode dies from a side, away from the plurality of light-emitting diode dies, of the base substrate by using laser with a preset irradiation frequency in a preset ambient atmosphere to decompose the sacrificial layer under irradiation of the laser, so that the at least some light-emitting diode dies are separated from the base substrate.

In some embodiments, the sacrificial layer includes a part of the first semiconductor layer, and a light-emitting surface of the light-emitting diode die has a middle region and an edge region surrounding the middle region.

While irradiating each of the at least some light-emitting diode dies from the side, away from the plurality of light-emitting diode dies, of the base substrate by using the laser with the preset irradiation frequency in the preset ambient atmosphere to decompose the sacrificial layer under the irradiation of the laser, so that the at least some light-emitting diode dies are separated from the base substrate, the manufacturing method further includes:

controlling laser energy received by different portions of each of the at least some light-emitting diode dies to form at least one depression in a middle region of a light-emitting surface of each of the at least some light-emitting diode dies.

In some embodiments, irradiating each of the at least some light-emitting diode dies from the side, away from the plurality of light-emitting diode dies, of the base substrate by using the laser with the preset irradiation frequency in the preset ambient atmosphere includes:

scanning each of the at least some light-emitting diode dies in a first direction through a laser scanner in the preset ambient atmosphere, the first direction being parallel to a plane where the backplane is located; and controlling the laser energy received by the different portions of each of the at least some light-emitting diode dies includes:

controlling residence times of the laser generated by the laser scanner at different portions of each of the at least some light-emitting diode dies or a duty cycle of the laser generated by the laser scanner to control the laser energy received by the different portions of each of the at least some light-emitting diode dies.

In some embodiments, the manufacturing method further includes: forming an electrode pattern on a side, away from the backplane, of a first semiconductor layer of each of the at least some light-emitting diode dies, the electrode pattern being formed in an edge region of a light-emitting surface of the light-emitting diode die; and etching a surface, away from a light-emitting material layer, of the first semiconductor layer of the light-emitting diode die by using the electrode pattern as a mask to form at least one depression in a middle region of the surface of the first semiconductor layer of the light-emitting diode die.

In some embodiments, the manufacturing method further includes: forming a second conductive layer on a side, away from the backplane, of a first semiconductor layer of each of the at least some light-emitting diode dies, a surface of the second conductive layer having a shape same as a shape of a surface of the first semiconductor layer, and the second conductive layer being in direct contact with the first semiconductor layer.

In some embodiments, providing the base substrate carrying the plurality of light-emitting diode dies includes:

forming epitaxial layers on the base substrate through an epitaxial process, the epitaxial layer including a first semiconductor film, a light-emitting film and a second semiconductor film that are sequentially arranged in the direction away from the base substrate, the first semiconductor film being bonded with the base substrate through a sacrificial material layer, a material of the sacrificial material layer being decomposable under the laser irradiation;

forming a conductive film on the second semiconductor film; and dividing an entirety of the epitaxial layers and the conductive film into the plurality of light-emitting diode dies.

In some embodiments, dividing the entirety of the epitaxial layers and the conductive film into the plurality of light-emitting diode dies includes:

dividing the entirety of the epitaxial layers and the conductive film into the plurality of light-emitting diode dies through a patterning process.

In some embodiments, a dimension of each light-emitting diode die in a second direction increases in the first direction; or a dimension of each light-emitting diode die in a second direction increases and then decreases in the first direction.

The second direction is perpendicular to the first direction and parallel to the plane where the backplane is located.

In some embodiments, a preset ambient atmosphere is an air atmosphere with a humidity lower than 5%, the air atmosphere contains hydrogen chloride vapor or hydrogen chloride mist, and a molarity of the hydrogen chloride vapor or the hydrogen chloride mist is greater than 0.1 mol/L.

In some embodiments, the preset irradiation frequency is 0.1 Hz to 1 kHz, inclusive.

In some embodiments, the manufacturing method further includes: cooling the at least some light-emitting diode dies after the laser ablation by using nitrogen with a temperature lower than 25° C., and removing residues after the laser ablation.

In another aspect, a micro light-emitting diode display panel is provided. The micro light-emitting diode display panel includes: a backplane having a plurality of bonding structures, and a plurality of light-emitting diode dies disposed on the backplane and bonded with at least some bonding structures in the backplane. Each light-emitting diode die includes a first semiconductor layer, a light-emitting material layer, a second semiconductor layer and a first conductive layer that are sequentially disposed in a direction proximate to the backplane. Each light-emitting diode die is bonded with a single bonding structure of the at least some bonding structures through the first conductive layer.

In some embodiments, a surface, away from the first conductive layer, of each light-emitting diode die is a light-emitting surface, the light-emitting surface has a middle region and an edge region surrounding the middle region, the middle region has at least one depression formed therein.

In some embodiments, a longitudinal section of each depression is in a shape of an arc, a letter V, or an inverted trapezoid, the longitudinal section of each depression is perpendicular to a plane where the backplane is located.

The at least one depression includes one depression; or the at least one depression includes a plurality of depressions sequentially arranged in a first direction, the first direction is parallel to both the plane where the backplane is located and the longitudinal section of each depression.

In some embodiments, a dimension of each light-emitting diode die in a second direction increases in the first direction; or a dimension of each light-emitting diode die in a second direction gradually increases and then decreases in the first direction.

The second direction is perpendicular to the first direction and parallel to the plane where the backplane is located.

In some embodiments, a cross section of each light-emitting diode die is in a shape of a trapezoid or a circle. A first base and a second base of the trapezoid are sequentially arranged in the first direction, and the cross section is parallel to the plane where the backplane is located.

In some embodiments, in a case where the cross section of the light-emitting diode die is in the shape of the trapezoid, dimensions of the trapezoid satisfies conditions that, b is greater than 2a and c is less than b (b>2a, and c<b), wherein a is a dimension of the first base of the trapezoid, b is a dimension of the second base of the trapezoid, and c is a height of the trapezoid.

In some embodiments, a distance from a lowest point of each depression to a surface, proximate to the backplane, of the first semiconductor layer is within a range of 2 μm to 5 μm, inclusive.

In some embodiments, in a case where the longitudinal section of each depression is in the shape of the arc, a curvature of the arc is not greater than 0.3.

In some embodiments, the display panel further includes an electrode pattern. The electrode pattern is located on a side, away from the backplane, of the first semiconductor layer and disposed in an edge region of the light-emitting surface.

In some embodiments, the display panel further includes a second conductive layer. The second conductive layer is located on a side, away from the light-emitting material layer, of the first semiconductor layer and in direct contact with the first semiconductor layer. A surface of the second conductive layer has a shape same as a shape of a surface of the light-emitting surface.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
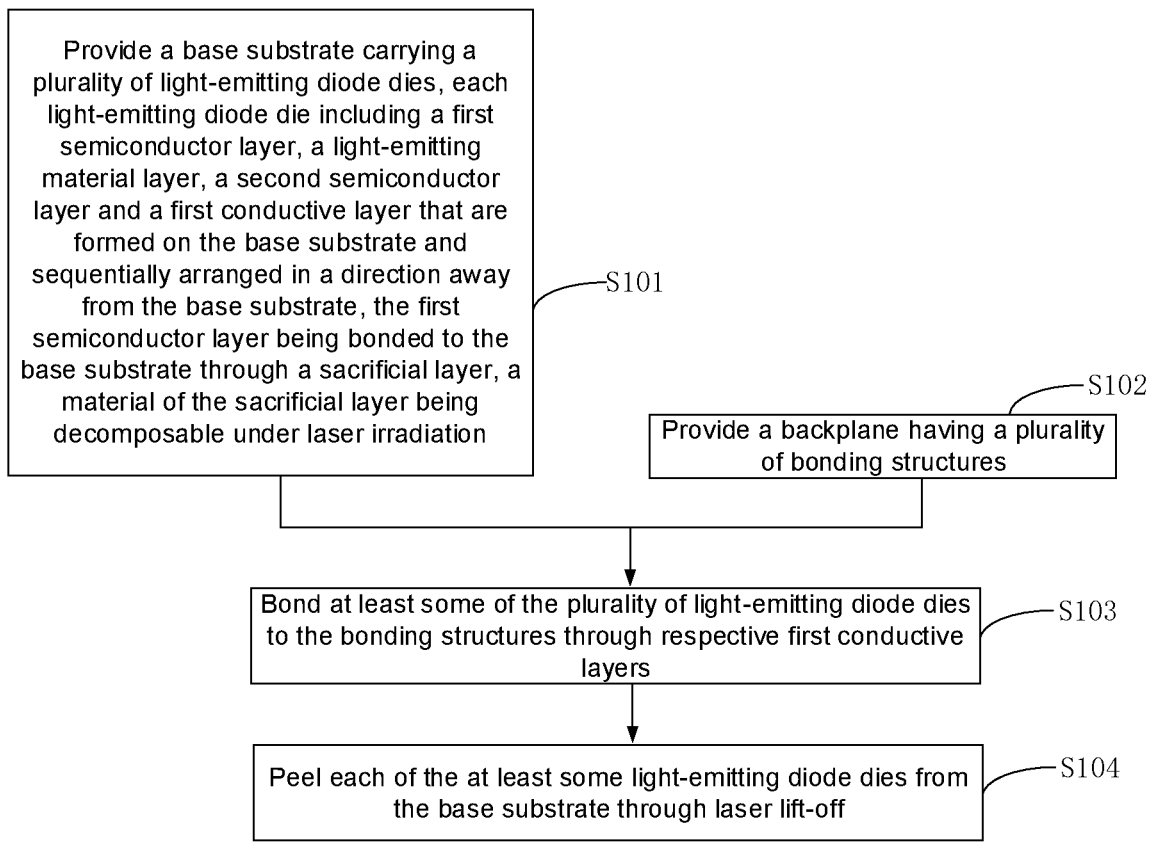
FIG. 1 is a flow diagram of a manufacturing method for a micro light-emitting diode display panel, in accordance with embodiments of the present disclosure.

Technical solutions in some embodiments of the present disclosure will be described clearly and completely below with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. The term "coupled" or "communicatively coupled", however, may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Exemplary embodiments are described herein with reference to sectional views and/or plan views as idealized exemplary drawings. In the accompanying drawings, thicknesses of layers and regions may be exaggerated for clarity. Therefore, variations in shape with respect to the drawings due to, for example, manufacturing techniques and/or tolerances may be envisaged. Therefore, exemplary embodiments should not be construed as being limited to the shapes of the regions shown herein, but include deviations in shape due to, for example, manufacturing. For example, an etched region shown as a rectangle generally has a curved feature. Therefore, the regions shown in the accompanying drawings are schematic in nature, and their shapes are not intended to show actual shapes of the region in a device, and are not intended to limit the scope of the exemplary embodiments.

The embodiments of the present disclosure are described below in detail. Examples of the embodiments are shown in the accompanying drawings, wherein consistently same or similar reference signs indicate same or similar elements, or elements with same or similar functions. The embodiments to be described below with reference to the accompanying drawings are exemplary, and are only used to explain the present disclosure, and cannot be construed as limitations on the present disclosure.

A commonly used laser transfer has the following disadvantages. First, at least one carrier (sticky substrate or transfer substrate) needs to be used as a transfer layer, and there are many steps and devices to be transferred in coordination, so that a transfer efficiency is low, and a transfer accuracy is limited. Second, only a transfer of micro LED dies with a horizontal structure may be achieved, and a transfer of micro LED dies with a vertical structure is difficult to be achieved, which means an insufficient compatibility.

Some embodiments of the present disclosure provide a manufacturing method for a micro light-emitting diode (LED) display panel. A flow diagram of the manufacturing method is shown in FIGS. 1, 2, 4, 5 and 9. The manufacturing method includes steps 101 to 104 (S101 to S104).

In S101, a base substrate 200 carrying a plurality of LED dies 300 is provided. Each LED die 300 includes a first semiconductor layer 340, a light-emitting material layer 330, a second semiconductor layer 320 and a first conductive layer 310 that are formed on the base substrate 200 and sequentially arranged in a direction away from the base substrate 200. The first semiconductor layer 340 is bonded with the base substrate 200 through a sacrificial layer 350. A material of the sacrificial layer 350 is decomposable under laser irradiation.

The base substrate 200 may be a transfer substrate or a wafer substrate, which is not limited here. In a case where the base substrate 200 is the transfer substrate, the sacrificial layer 350 may be a material layer capable of being bonded with the first semiconductor layer 340 through certain bonding force, so as to make sure that the transfer substrate may pick up the LED dies 300. Since the material of the sacrificial layer 350 is decomposable under the laser irradiation, the transfer substrate may be separated from the LED dies 300. In a case where the base substrate 200 is the wafer substrate, according to a fact that the LED dies 300 may be formed through an epitaxial process, it can be seen that the sacrificial layer 350 may be a buffer layer formed between the first semiconductor layer 340 and the wafer substrate, and/or a part of the first semiconductor layer 340.

The base substrate 200 may be made of a transparent material, so as to facilitate laser acting on the sacrificial layer after passing through the base substrate 200 in a subsequent method by using laser lift-off, thereby achieving peeling of the LED dies 300 from the base substrate 200.

In some embodiments, providing the base substrate 200 carrying the plurality of LED dies 300 includes the following steps.

Epitaxial layers are formed on the base substrate 200 through the epitaxial process. The epitaxial layers include a first semiconductor film, a light-emitting film and a second semiconductor film that are sequentially arranged in the direction away from the base substrate 200. The first semiconductor film is bonded with the base substrate through a sacrificial material layer, and a material of the sacrificial material layer is decomposable under the laser irradiation.

That is, the base substrate 200 is the wafer substrate. For example, the base substrate 200 may sapphire. A material of the first semiconductor film is the same as a material of the first semiconductor layer 340, which may be, for example, an N-type semiconductor material such as gallium nitride. A material of the light-emitting film is the same as a material of the light-emitting material layer 330, which may be, for example, a material of a multiple quantum well structure. A material of the second semiconductor film is the same as a material of the second semiconductor layer 320, which may be, for example, a P-type semiconductor material, or gallium nitride. The material of the sacrificial material layer is the same as a material of the buffer layer, and/or, the sacrificial material layer is a part of the first semiconductor film. For example, the buffer layer may be made of gallium nitride. Gallium nitride can be decomposed into nitrogen ($N_2$) and metal gallium under the laser ablation. By decomposing the buffer layer into nitrogen and metal gallium under the laser ablation, and/or, by decomposing the part of the first semiconductor film into nitrogen and metal gallium under the laser ablation, a separation between the base substrate 200 and the LED dies 300 is achieved.

A conductive film is formed on the second semiconductor film.

The conductive film may be formed on the second semiconductor film through depositing.

In some embodiments, an indium tin oxide (ITO) film is grown on the second semiconductor film through the epitaxial process to form the conductive film.

The epitaxial layers and the conductive film are divided into the plurality of LED dies 300.

For example, a scribing method may be used to divide the epitaxial layers and the conductive film into the plurality of LED dies 300.

Here, it will be noted that, in a case where cross-sectional shapes of the plurality of LED dies 300 are rectangles, after the epitaxial layers and the conductive film are divided into the plurality of LED dies 300 through the scribing method, the plurality of LED dies 300 may be arranged in an array, so that positions of at least some LED dies 300 of the plurality of LED dies 300 correspond to positions of bonding structures in a backplane.

In some embodiments, dividing the epitaxial layers and the conductive film into the plurality of LED dies 300 may include:

dividing the epitaxial layers and the conductive film into the plurality of LED dies 300 through a patterning process.

In these embodiments, the patterning process may be achieved by using a mask. A pattern of the mask may match a pattern of the bonding structures in the backplane. That is, hollowed-out regions of the mask correspond to positions of gaps between the plurality of LED dies 300 to be formed in the epitaxial layers and the conductive film, so as to etch portions, between the plurality of LED dies 300 to be formed, of the epitaxial layers and the conductive film. As a result, the plurality of LED dies 300 may be formed on the base substrate 200, and the positions of the at least some LED dies 300 of the plurality of LED dies 300 correspond to the positions of the bonding structures in the backplane.

In addition, in these embodiments, it may also be possible to form LED dies 300 whose cross sections are of other shapes. For example, the cross-sectional shape of the LED die 300 may also be a trapezoid, a triangle, an ellipse, etc., which is not limited here. Accordingly, in a case where the LED dies 300 of these shapes are formed, masks with corresponding shapes may be used.

In S102, a backplane 100 having a plurality of bonding structures 110 is provided.

In some embodiments, providing the backplane 100 having the plurality of bonding structures 110 in S102 may include: depositing a conductive layer on a substrate 10, and patterning the conductive layer through a patterning process to obtain the bonding structures 110. The conductive layer may be patterned by using the above mask, so that pattern shapes of the bonding structures 110 match the cross-sectional shapes of the plurality of LED dies 300. That is, the mask may be the same mask used to divide the epitaxial layers and the conductive film into the plurality of LED dies 300 through the above patterning process.

Here, the substrate 10 may be a substrate provided with driving devices 120 used to drive the LED dies 300 to emit light. The driving device may be, for example, a thin film transistor (TFT), a driving integrated circuit (IC), etc.

For example, in a case where the substrate 10 is the substrate provided with the TFTs, before depositing the conductive layer on the substrate 10 and patterning the conductive layer through the patterning process to obtain the bonding structures 110, the method may further include the following steps. A gate metal film (e.g., Mo metal film) is deposited on the substrate, a thickness thereof may be 200 nm, and patterned to obtain gate patterns; a gate insulating layer is formed on the gate patterns, a material of the gate insulating layer may be silicon dioxide ($SiO_2$), and a thickness thereof may be 150 nm; active layers (indium gallium zinc oxide (IGZO)) are formed on the gate insulating layer, and a thickness thereof may be 40 nm; an interlayer insulating layer is formed on the active layers; a source-drain metal layer is formed on the interlayer insulating layer, a material of the source-drain metal layer may be metal Mo, and a thickness thereof may be 200 nm; a passivation layer, such as a $SiO_2$ film, is formed on the source-drain metal layer and is patterned; pixel electrodes Ti/Al/Ti (laminated metals of Ti, Al and Ti) are formed on the passivation layer, a thickness thereof may be 400 nm, and the pixel electrodes may be the bonding structures described above; and finally a spacer layer is formed on the substrate, a height of the spacer layer may be the same as a height of the LED dies 300, so as to facilitate the transfer of the LED dies 300 to corresponding positions of the backplane through the laser lift-off.

In S103, at least some LED dies 300 of the plurality of LED dies 300 are bonded to bonding structures 110 through respective first conductive layers 310.

Bonding the at least some LED dies 300 of the plurality of LED dies 300 to the bonding structures 110 through the respective first conductive layers 310 in S103 may include: making the first conductive layers 310 of the at least some LED dies 300 undergo a eutectic reaction with the bonding structures 110 to achieve bonding with the bonding structures 110.

The eutectic reaction refers to a reaction in which a liquid with a certain composition crystallizes into two solid phases with certain compositions simultaneously at a certain temperature. Here, considering an example where a material of the first conductive layer 310 is Ti/Al (laminated metals of Ti and Al) or Ti/Au (laminated metals of Ti and Au), a material of the bonding structure may be Ti/Al/Ti. Under a heating condition, Ti metal is capable of undergoing the eutectic reaction with Au metal to form a eutectic alloy of Ti and Au, so that the first conductive layer 310 is bonded with the bonding structure.

In S104, each of the at least some LED dies 300 is peeled from the base substrate 200 through the laser lift-off.

Here, the at least some LED dies 300 may firstly be peeled from the base substrate 200 to drop onto corresponding positions of the backplane 100 through the laser lift-off, and then bonded with the bonding structures 110. Alternatively, the at least some LED dies 300 may firstly be bonded with the bonding structures 110, and then peeled from the base substrate 200 through the laser lift-off, so as to achieve the separation of the LED dies 300 from the base substrate 200. There is no limitation here.

Figure 2:
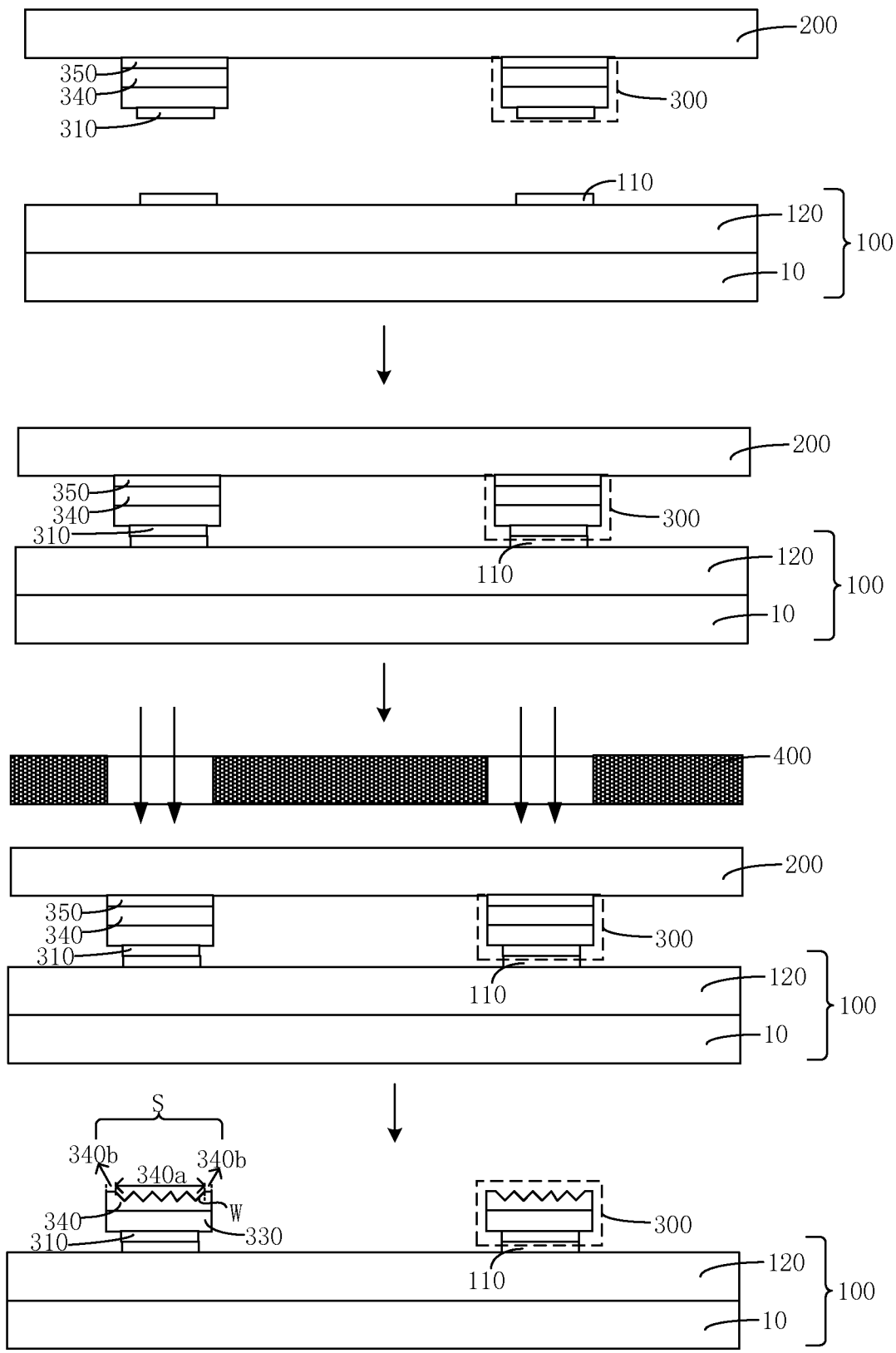
FIG. 2 is a diagram showing a process of bonding light-emitting diode dies with bonding structures first, and then peeling the light-emitting diode dies from a base substrate through laser lift-off, in accordance with embodiments of the present disclosure.

It will be noted that the at least some LED dies 300 can be transferred to the corresponding positions of the backplane 100 through any one of the two methods. A difference of the two methods is that, in an implementation method where the at least some LED dies 300 are firstly peeled from the base substrate 200 to drop onto the corresponding positions of the backplane 100 through the laser lift-off, and then bonded with the bonding structures 110, gas will be generated during the laser lift-off process, which is prone to cause an impact on the LED dies 300. Therefore, it is not favorable for the LED dies 300 dropping onto accurate positions of the backplane 100. This implementation manner is more suitable for a solution of positioning the LED dies 300 by means of the above spacer layer. That is, it may be possible to form the spacer layer with a certain structure to limit the positions of the LED dies 300 on the backplane 100. As shown in FIG. 2, in an implementation method where the at least some LED dies 300 are firstly bonded with the bonding structures 110, and then peeled from the base substrate 200 through the laser lift-off to achieve the separation of the LED dies 300 from the base substrate 200, before performing the laser lift-off, the positioning of the LED dies 300 on the backplane 100 has been achieved by bonding the LED dies 300 with the bonding structures 110, and in the subsequent laser lift-off process, it only needs to separate the LED dies 300 from the base substrate 200.

Compared with a solution in the related art that when LED dies 300 are transferred through the laser lift-off, at least one carrier is required as a transfer layer, and only the transfer of micro LED dies with a horizontal structure may be achieved, in the manufacturing method for the micro LED display panel provided in the embodiments of the present disclosure, the LED dies 300 are directly transferred to the backplane 100 through a combination of a selective laser lift-off and an electrode bonding method, which only requires a single transfer step and no transfer layer. As a result, transfer steps and the number of devices used for transfer are reduced, and a transfer efficiency is greatly increased; in addition, it may also be possible to achieve the transfer of micro LED dies with a vertical structure, and to increase the transfer accuracy.

In some possible implementation manners, in the manufacturing method provided above, S101 may be firstly performed, that is, the forming of the plurality of LED dies 300 on the base substrate 200 is firstly completed, and then S102 is performed, that is, the backplane 100 having the plurality of bonding structures 110 is formed, and then S103 and S104 are performed.

In some other possible implementation manners, in the manufacturing method provided above, S102 may be firstly performed, that is, the backplane 100 having the plurality of bonding structures 110 is firstly formed, and then S101 is performed, that is, the forming of the plurality of LED dies 300 on the base substrate 200 is completed, and then S103 and S104 are performed.

In yet some other possible implementation manners, in the manufacturing method provided above, during a process of performing S101, S102 is performed simultaneously, and then S103 and S104 are performed.

In some embodiments, peeling each of the at least some LED dies 300 from the base substrate 200 through the laser lift-off may include:

performing laser ablation on the sacrificial layer 350 on each of the at least some LED dies 300 to separate the LED dies 300 from the base substrate 200.

In some embodiments, performing the laser ablation on the sacrificial layer 350 on each of the at least some LED dies 300 to separate the LED dies 300 from the base substrate 200 may include the following steps.

As shown in FIG. 2, remaining LED dies 300 of the plurality of LED dies 300 other than the at least some LED dies 300 are covered.

With continuous reference to FIG. 2, a mask 400 may be used to cover the remaining LED dies 300 of the plurality of LED dies 300 other than the at least some LED dies 300. A portion, used to cover the remaining LED dies 300 of the plurality of LED dies 300 other than the at least some LED dies 300, of the mask 400 may block the laser from irradiating the remaining LED dies 300 of the plurality of LED dies 300 other than the at least some LED dies 300.

As shown in FIG. 2, in a preset ambient atmosphere, the laser with a preset irradiation frequency is used to irradiate each of the at least some LED dies 300 from a side of the base substrate 200 away from the LED dies 300, so that the sacrificial layer 350 is decomposed under the irradiation of the laser, and then the LED dies 300 are separated from the base substrate 200.

Here, according to the fact that the sacrificial layer 350 may be the buffer layer or the part of the first semiconductor layer 340, it can be seen that after the LED dies 300 are separated from the base substrate 200, a thickness of the first semiconductor layer 340 may be equal to or less than a thickness of the first semiconductor layer 340 before the LED dies 300 are separated from the base substrate 200.

Here, there are two possible cases. In a first case, the buffer layer is provided between the LED dies 300 and the base substrate 200. That is, the LED dies 300 are bonded with the base substrate 200 through the buffer layer. In this case, there are two situations. In a first situation, the sacrificial layer 350 is the buffer layer, and after the LED dies 300 are separated from the base substrate 200, that is, the buffer layer is decomposed, the thickness of the first semiconductor layer 340 remains unchanged; in a second situation, the sacrificial layer 350 includes the buffer layer and the part of the first semiconductor layer 340, and after the LED dies 300 are separated from the base substrate 200, that is, the part of the first semiconductor layer 340 is decomposed as well as the buffer layer, the thickness of the first semiconductor layer 340 becomes small. In a second case, no buffer layer is provided between the LED dies 300 and the base substrate 200. That is, the LED dies 300 are directly bonded with the base substrate 200 through the first semiconductor layer 340. In this case, the sacrificial layer 350 is the part of the first semiconductor layer 340, and after the LED dies 300 are separated from the base substrate 200, that is, the part, serving as the sacrificial layer 350, of the first semiconductor layer 340 is decomposed, the thickness of the first semiconductor layer 340 becomes small.

In some embodiments, as shown in FIG. 2, the sacrificial layer 350 includes the part of the first semiconductor layer 340, and a light-emitting surface S of each LED die 300 has a middle region 340a and an edge region 340b surrounding the middle region 340a. While the laser with the preset irradiation frequency is used to irradiate each of the at least some LED dies 300 from the side of the base substrate 200 away from the LED dies 300, so that the sacrificial layer 350 is decomposed under the irradiation of the laser, and then the LED dies 300 are separated from the base substrate 200, the manufacturing method further includes:

as shown in FIG. 2, controlling laser energy received by different portions of each of the at least some LED dies 300 to form at least one depression W in the middle region 340a of the light-emitting surface S of each of the at least some LED dies 300.

That is, while the LED die 300 is separated from the base substrate 200, the same mask 400 used in the above laser lift-off is used to form the at least one depression W in the middle region 340a of the light-emitting surface of the LED die 300 through a laser etching.

Figure 3:
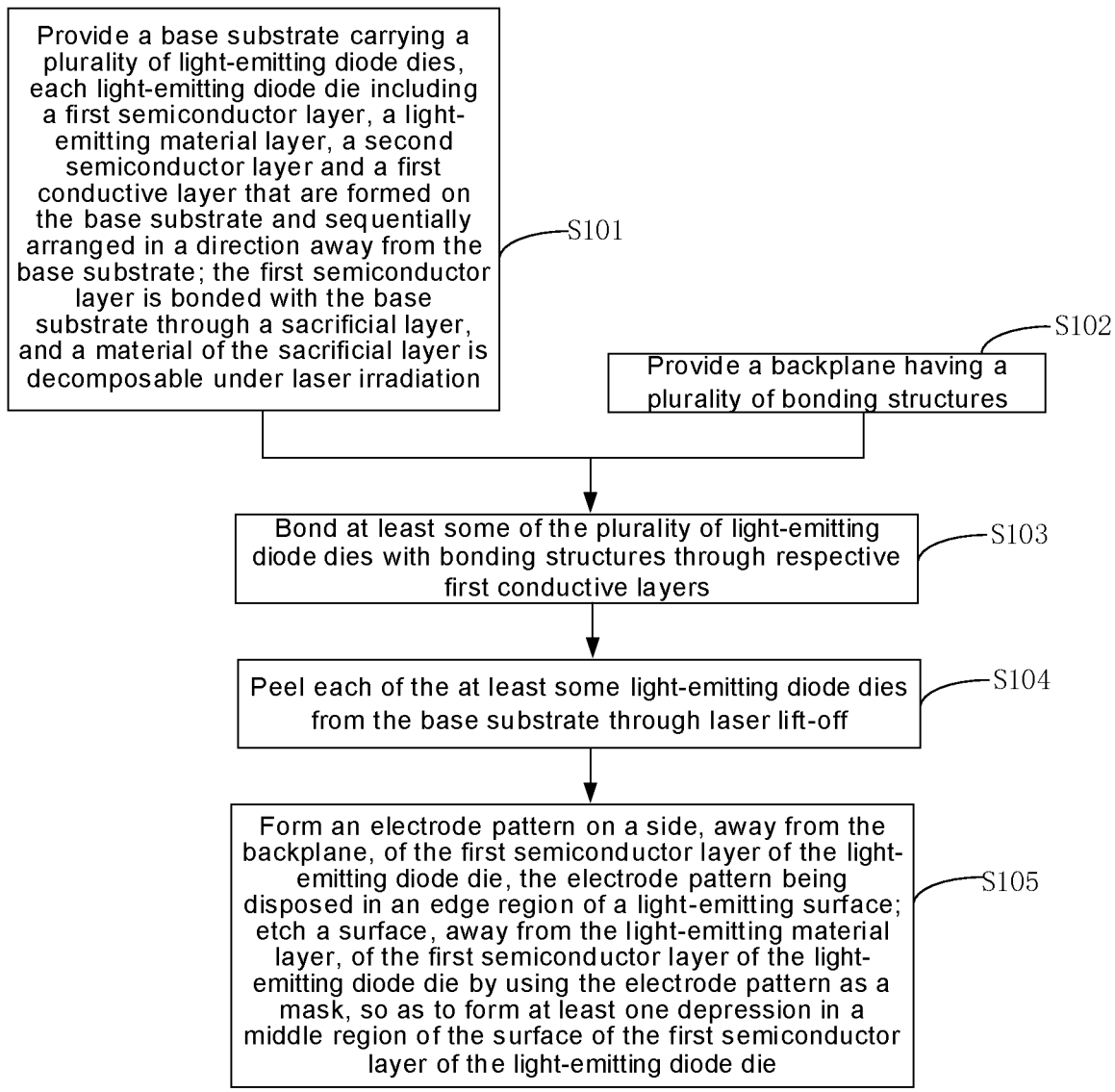
FIG. 3 is a flow diagram of a manufacturing method for another micro light-emitting diode display panel, in accordance with embodiments of the present disclosure.

In some other embodiments, as shown in FIG. 3, the manufacturing method further includes S105. In S105, as shown in FIG. 4, an electrode pattern 360 is formed on a side, away from the backplane 100, of the first semiconductor layer 340 of the LED die 300 and in the edge region 340b of the light-emitting surface; and a surface, away from the light-emitting material layer 330, of the first semiconductor layer 340 of the LED die 300 is etched by using the electrode pattern 360 as a mask, so that at least one depression W is formed in the middle region 340a of the surface of the first semiconductor layer 340 of each LED die 300.

That is, after the LED die 300 is separated from the base substrate 200, the electrode pattern 360 is firstly formed, and then the surface, away from the light-emitting material layer 330, of the first semiconductor layer 340 of the LED die 300 is etched by using the electrode pattern 360 as the mask, so that the at least one depression W is formed in the middle region 340a of the surface of the first semiconductor layer 340 of each LED die 300.

After the electrode pattern 360 is formed, performing the laser ablation on the first semiconductor layer 340 by using the electrode pattern 360 as the mask means that a shape of the electrode pattern 360 does not limited by a surface structure of the first semiconductor layer 340, which may reduce a difficulty of forming the electrode pattern 360.

Figure 4:
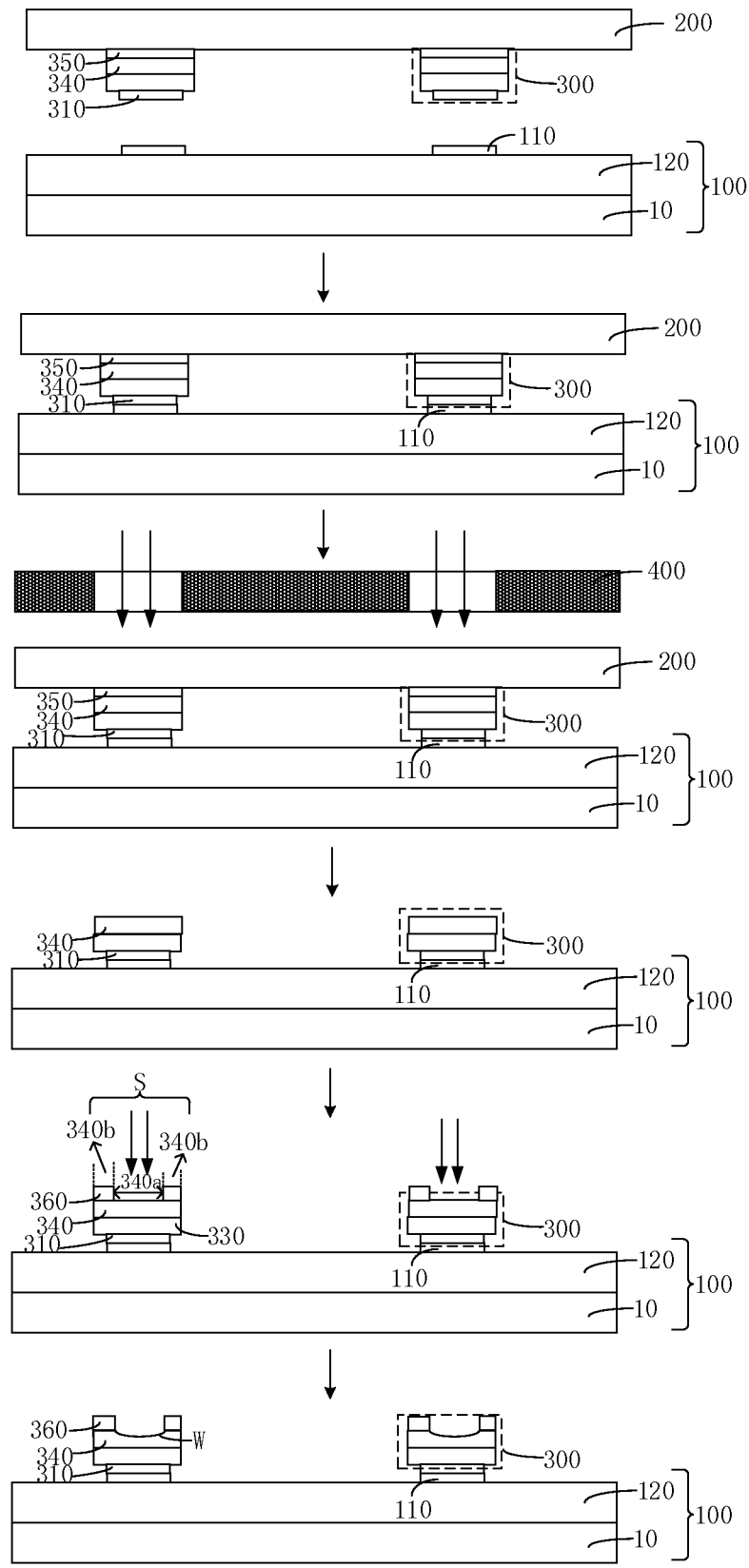
FIG. 4 is a diagram showing a process of forming electrode patterns each on a side, away from a backplane, of a first semiconductor layer of a light-emitting diode die, and forming at least one depression in the side, away from a light-emitting material layer, of the first semiconductor layer by using the electrode pattern as a mask, in accordance with embodiments of the present disclosure.

As shown in FIG. 4, the electrode pattern 360 may be an annular electrode pattern, so as to cause the middle region 340a in the surface, away from the light-emitting material layer 330, of the first semiconductor layer 340 of the LED die 300 to form a structure concave towards the light-emitting material layer 330, which improves uniformity of current distribution and conductivity of the LED die 300 with the vertical structure.

Figure 5:
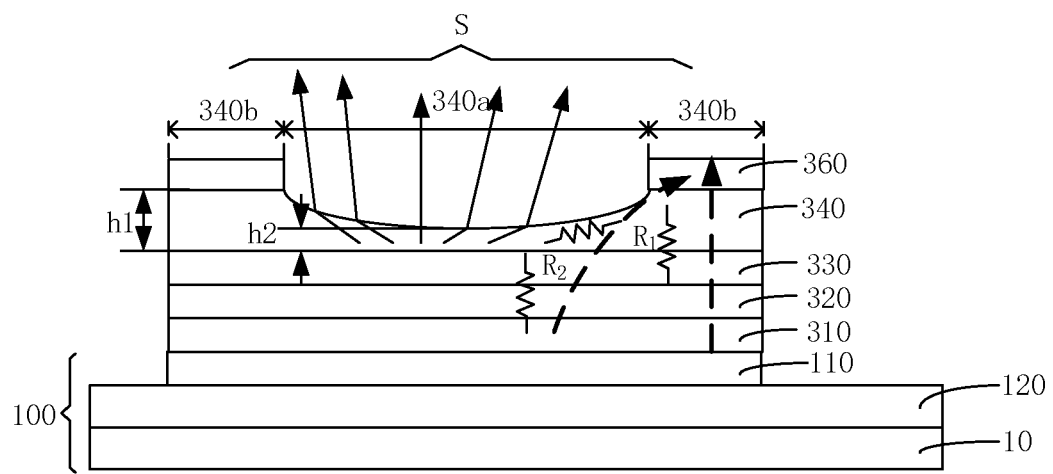
FIG. 5 is a structural diagram of a light-emitting diode die whose light-emitting surface has at least one depression formed therein, in accordance with embodiments of the present disclosure.
Figure 6:
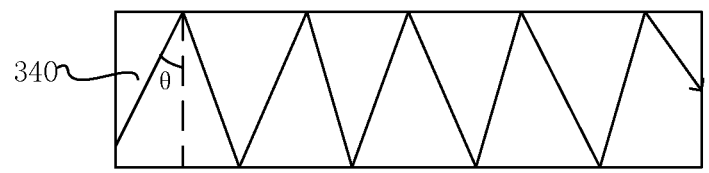
FIG. 6 is a structural diagram of a light-emitting diode die whose light-emitting surface is a plane in related art.
Figure 7:
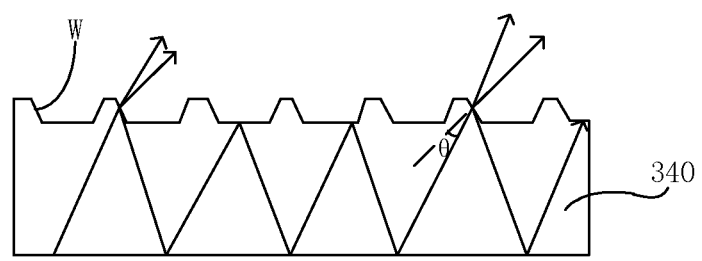
FIG. 7 is a structural diagram of another light-emitting diode die whose light-emitting surface has at least one depression formed therein, in accordance with embodiments of the present disclosure.

The solid arrows in FIG. 5 represent light exit directions of the LED die 300. By forming the at least one depression W in the middle region 340a of the light-emitting surface S of each of the at least some LED dies 300, light extraction may be increased compared with a case that the light-emitting surface of the LED die 300 is a plane (as shown in FIG. 6). This is because, as shown in FIGS. 5 and 7, the first semiconductor layer 340 of the LED die 300 has a relatively high refractive index, and by forming the at least one depression W in the middle region 340a of the first semiconductor layer 340 of the LED die 300, it may be possible to adjust an exit angle θ of light entering the first semiconductor layer 340, and thus avoid total reflection of the light propagating from a medium with a high refractive index into a medium with a low refractive index (as shown in FIG. 6). In addition, in a structure of the LED die 300, there are two conductive paths, represented by the dotted arrows in FIG. 5, from the first conductive layer 310 to the electrode pattern 360. One conductive path is a path facing the electrode pattern 360 in a direction perpendicular to the first conductive layer 310, and an equivalent resistance of this path is denoted as $R_1$; the other conductive path is a path that does not face the electrode pattern 360 in the direction perpendicular to the first conductive layer 310, and an equivalent resistance of this path is denoted as $R_2$. After the at least one depression W is formed in the surface, away from the light-emitting material layer 330, of the first semiconductor layer 340 of the LED die 300, the path with the equivalent resistance of $R_2$ is shortened compared with the case where the surface, away from the light-emitting material layer 330, of the first semiconductor layer 340 of the LED die 300 is the plane, so that a value of $R_2$ becomes small, and the value of $R_2$ may be close to that of $R_1$, and thus it may be possible to improve the uniformity of current distribution in the vertical structure and the conductivity of the vertical structure.

During the laser ablation process, as shown in FIG. 2, edges of the hollowed-out regions of the mask 400 may shield the laser ablation to a certain extent. That is, a laser ablation rate of a portion of the first semiconductor layer 340 corresponding to an edge of a hollowed-out region of the mask 400 is lower than a laser ablation rate of a portion of the first semiconductor layer 340 corresponding to a center of the hollowed-out region of the mask 400. Thus, by using a difference in the ablation rates, it may be possible to ablate the surface, away from the backplane 100, of the first semiconductor layer 340 to obtain the at least one depression W, and then obtain a required depth of the depression W by controlling an intensity and an irradiation duration of the laser.

Figure 8:
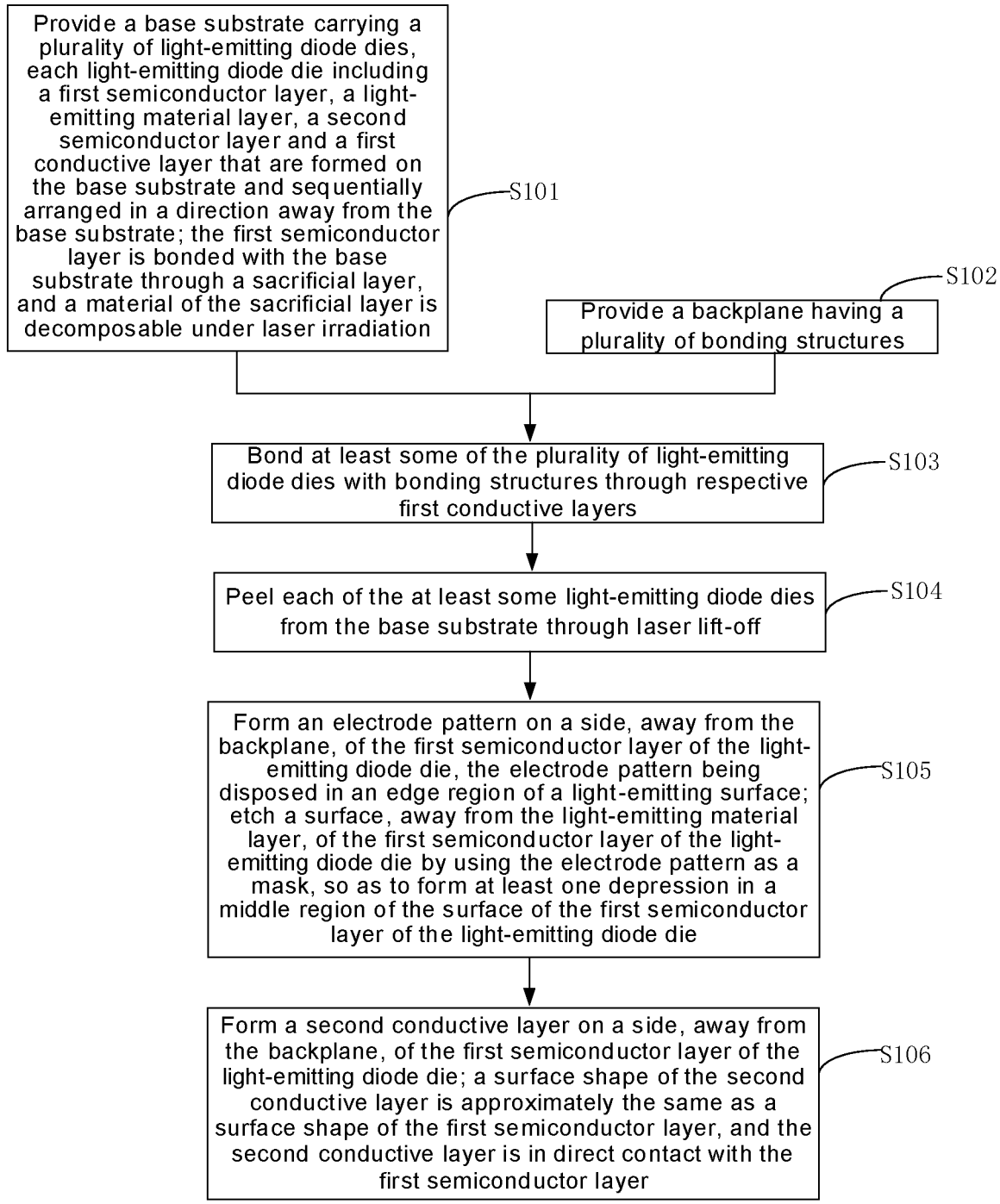
FIG. 8 is a flow diagram of a manufacturing method for yet another micro light-diode display panel, in accordance with embodiments of the present disclosure.
Figure 9:
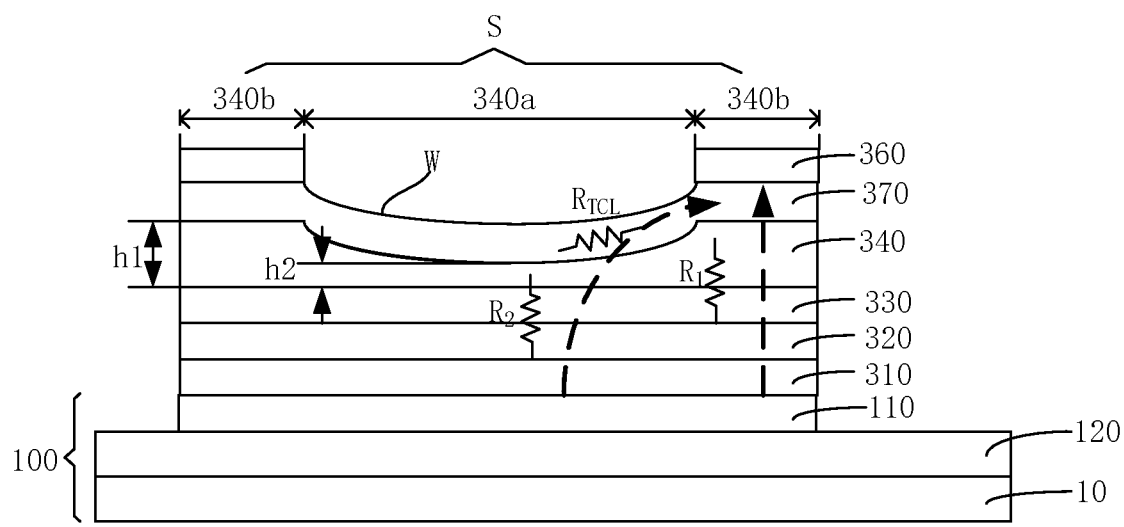
FIG. 9 is a structural diagram of a light-emitting diode die having a second conductive layer formed on a side, away from a backplane, of a first semiconductor layer of the light-emitting diode die, in accordance with embodiments of the present disclosure.

In some embodiments, as shown in FIG. 8, the manufacturing method further includes S105. In S105, as shown in FIG. 9, a second conductive layer 370 is formed on a side, away from the backplane 100, of the first semiconductor layer 340 of the LED die 300. The second conductive layer 370 may be referred to as a top electrode layer (TCL). A surface shape of the second conductive layer 370 is substantially the same as a surface shape of the first semiconductor layer 340, and the second conductive layer 370 is in direct contact with the first semiconductor layer 340.

In these embodiments, by providing the second conductive layer 370, it may be possible to further improve the uniformity of current distribution and the conductivity of the vertical structure. In this case, in a structure of the LED die 300 as shown in FIG. 9, in a conductive path (represented by the dashed arrows in FIG. 9) that does not face the electrode pattern 360 in the direction perpendicular to the first conductive layer 310, an equivalent resistance thereof is equal to $(R_2+R_{TCL})$. Similar to the case where the second conductive layer is not formed, after the depression W is formed in the surface, away from the light-emitting material layer 330, of the first semiconductor layer 340 of the LED die 300, the equivalent resistance may also be reduced. Moreover, by providing the second conductive layer 370, the current distribution and the conductivity of the vertical structure may further be improved, and thus a current channel is formed, thereby reducing a current congestion existing in the LED die 300 with the vertical structure, and increasing a light extraction current efficiency.

In some embodiments, irradiating each of the at least some LED dies 300 from the side of the base substrate 200 away from the LED dies 300 in the preset ambient atmosphere by using the laser with the preset irradiation frequency includes the following steps.

Figure 10:
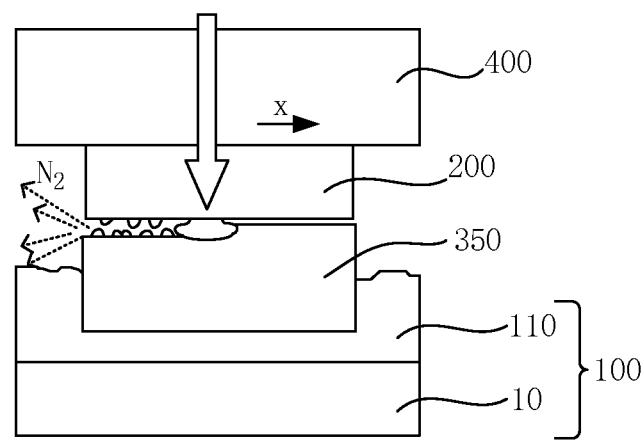
FIG. 10 is a diagram showing a process of performing laser ablation on a sacrificial layer by using a laser scanning method, in accordance with embodiments of the present disclosure.

As shown in FIG. 10, in the preset ambient atmosphere, a laser scanner is used to scan each of the at least some LED dies 300 in a first direction (represented by the arrow x in FIG. 10), where the first direction is parallel to a plane where the backplane 100 is located.

The preset ambient atmosphere may be an air atmosphere with a humidity lower than 5%, such as cold dry air (CDA). The air atmosphere is doped or not doped with hydrogen chloride vapor or hydrogen chloride mist, and a molarity of the hydrogen chloride vapor or hydrogen chloride mist is greater than 0.1 mol/L. In a case where the preset ambient atmosphere of laser ablation includes the hydrogen chloride vapor or hydrogen chloride mist with molarity greater than 0.1 mol/L, hydrogen chloride solution is suspended in the CDA as an aerosol, metal gallium generated through laser decomposition of gallium nitride may be dissolved and removed by using corrosiveness of hydrogen chloride, so as to accelerate the decomposition of the gallium nitride, and avoid decrease in a decomposition uniformity and a decomposition rate of the gallium nitride due to an accumulation of metal gallium.

In some embodiments, the preset irradiation frequency may be 0.1 Hz to 1 kHz, inclusive. The frequency is the number of periodic changes completed per unit time.

In the embodiments of the present disclosure, the laser may be generated by using a laser device with a model of "Excimer 248 nm laser" or "266 nm DPSS laser".

In some embodiments, after the laser ablation is completed, the manufacturing method further includes: cooling the LED dies 300 after laser ablation with nitrogen with a temperature lower than 25° C., and removing residues after laser ablation.

In these embodiments, in the laser ablation process, a large amount of heat will be generated, and metal gallium will remain, which may be removed by using 0.1 M (mol/L) hydrogen chloride (HCl).

Controlling the laser energy received by the different portions of each of the at least some LED dies 300 includes:

controlling residence times of the laser generated by the laser scanner at the different portions of each of the at least some LED dies 300 or a duty cycle of the laser generated by the laser scanner, so as to control the laser energy of each of the at least some LED dies 300.

That is, the at least one depression W may be formed in the middle region 340a of the light-emitting surface of the LED die 300 by means of the laser scanning and the mask 400.

The duty cycle refers to a ratio of a duration of positive pulses to a total period of pulses in an ideal pulse sequence (e.g., square waves).

In a case where the irradiation frequency of the laser is certain, by controlling the residence times of the laser generated by the laser scanner at the different portions of each of the at least some LED dies 300 or the duty cycle of the laser generated by the laser scanner, the laser energy of the LED die 300 at the different portions may be adjusted. As a result, an etching depth is adjusted, and the at least one depression W is formed in the middle region 340a of the light-emitting surface of the LED die 300.

Figure 11:
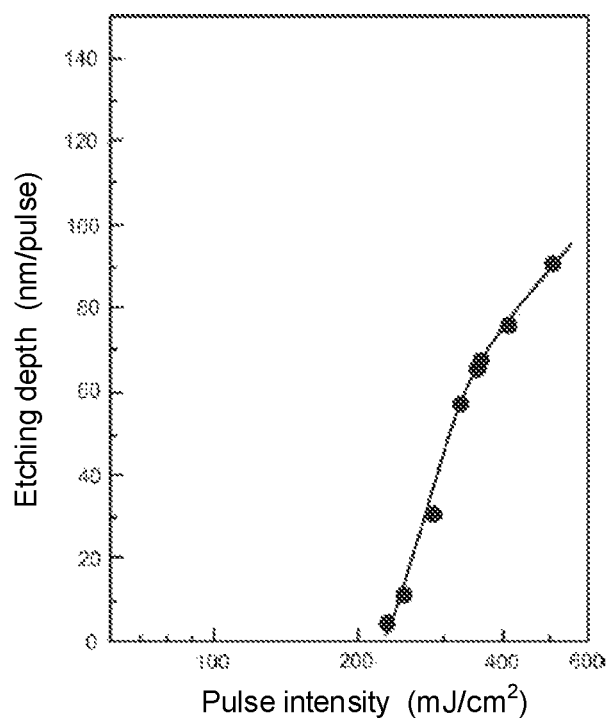
FIG. 11 is a diagram showing a corresponding relationship between different pulse intensities and etching depths of a unit pulse, in accordance with embodiments of the present disclosure.
Figure 12:
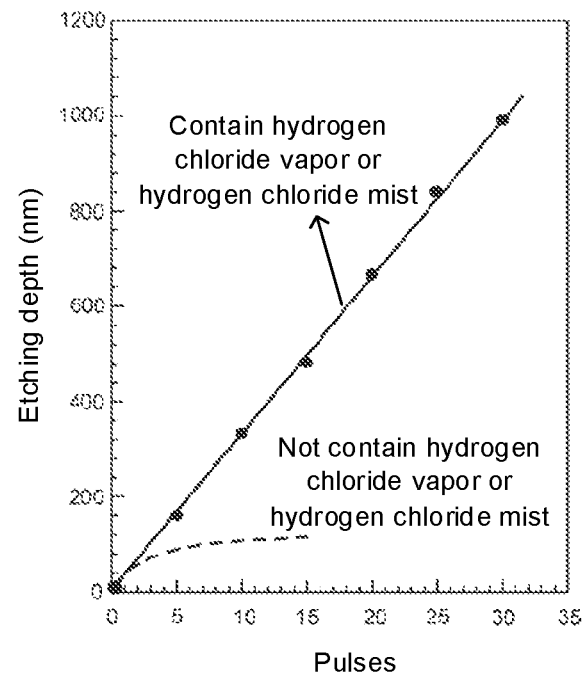
FIG. 12 is a comparison diagram showing a relationship between etching depths and pulses in a preset ambient atmosphere containing hydrogen chloride vapor or hydrogen chloride mist and a relationship between etching depths and pulses in a preset ambient atmosphere not containing hydrogen chloride vapor or hydrogen chloride mist in a same pulse intensity, in accordance with embodiments of the present disclosure.

FIG. 11 is a diagram showing a corresponding relationship between different pulse intensities and etching depths of a unit pulse. FIG. 12 is comparison diagram showing a relationship between etching depths and pulses in a preset ambient atmosphere containing hydrogen chloride vapor or hydrogen chloride mist and a relationship between etching depths and pulses in a preset ambient atmosphere not containing hydrogen chloride vapor or hydrogen chloride mist, in a same pulse intensity.

It can be seen from FIG. 11 that in a case where the pulse intensity is greater than 245 mJ/cm$^2$, as the pulse intensity increases, the etching depth of the unit pulse increases. It can be seen from FIG. 12 that, in a same pulse intensity such as 290 mJ/cm$^2$, in the case where the preset ambient atmosphere does not contain hydrogen chloride vapor or hydrogen chloride mist, the etching depth changes logarithmically; and in the case where the preset ambient atmosphere contains hydrogen chloride vapor or hydrogen chloride mist, the etching depth changes linearly. In addition, FIG. 12 shows a difference in etching rate changes between the two cases, and it can be seen that, the etching rate is larger in the case where the preset ambient atmosphere contains hydrogen chloride vapor or hydrogen chloride mist.

In some embodiments, a longitudinal section of each depression W is in a shape of an arc (as shown in FIG. 5), a letter V or an inverted trapezoid (as shown in FIG. 7), and the longitudinal section of each depression W is perpendicular to the plane where the backplane 100 is located. In a case where there are a plurality of depressions W, the plurality of depressions W are sequentially arranged in the first direction (represented by the arrow x in FIG. 13), and the first direction is parallel to both the plane where the backplane 100 is located and the longitudinal section of each depression W.

That is, by limiting the laser scanning direction to be parallel to both the plane where the backplane 100 is located and a plane where the longitudinal section of the LED die 300 is located, and adjusting the residence times of the laser generated by the laser scanner at the different portions or its duty cycle during the laser scanning process, the at least one depression W sequentially arranged in the first direction may be formed.

Figure 14:
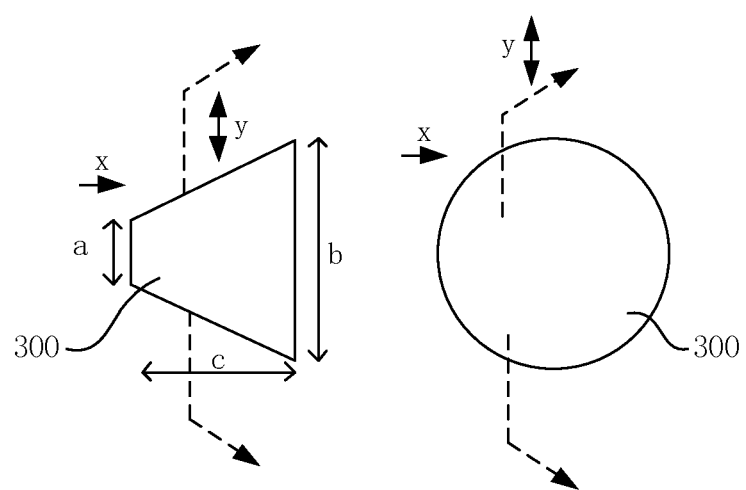
FIG. 14 is a diagram showing cross-sectional shapes of light-emitting diode dies, in accordance with some embodiments of the present disclosure.

In some embodiments, as shown in FIG. 14, a dimension of each LED die 300 in a second direction (a direction represented by the arrows y in FIG. 14) gradually increases in the first direction; alternatively, the dimension of each LED die 300 in the second direction gradually increases firstly and then gradually decreases in the first direction. The second direction is perpendicular to the first direction and parallel to the plane where the backplane 100 is located.

In these embodiments, by making the dimension of each LED die 300 in the direction perpendicular to the laser scanning direction gradually increase in the laser scanning direction, it is advantageous for a large amount of gas generated in the laser lift-off to escape in the second direction, which avoids a cracking of the LED die 300 due to poor exhaust in the laser scanning process, and thus a yield rate may be improved.

In some embodiments, as shown in FIG. 14, a cross section of each LED die 300 is in a shape of a trapezoid or a circle. A first base and a second base of the trapezoid are sequentially arranged in the first direction.

The solid arrows x in FIG. 14 indicate the laser scanning direction in the laser lift-off, and the dotted arrows in FIG. 14 indicate exhaust directions.

In some embodiments, as shown in FIG. 14, in a case where the cross section of the LED die 300 is in a shape of the trapezoid, dimensions of the trapezoid satisfy conditions that, b is greater than 2a and c is less than b (b>2a, and c<b), where a is the dimension of the first base of the trapezoid, b is a dimension of the second base of the trapezoid, and c is a height of the trapezoid.

In these embodiments, after the cross section of the LED die 300 satisfies the above dimension requirements, the nitrogen generated after the decomposition of gallium nitride may quickly escape the LED die 300 in the laser lift-off process, which may avoid the cracking of the LED die 300 due to an accumulation of nitrogen generated rapidly inside the LED die 300.

The dimensions of the trapezoid may be as follows: a is less than 100 μm (a<100 μm), b is less than 200 μm (b<200 μm), and c is less than 200 μm (c<200 μm).

Some embodiments of the present disclosure provide a micro LED display panel.

A structure of the display panel is shown in FIG. 5. The display panel includes a backplane 100 having a plurality of bonding structures, and a plurality of LED dies 300 bonded with at least some bonding structures 110 in the backplane 100. Each LED die 300 includes a first semiconductor layer 340, a light-emitting material layer 330, a second semiconductor layer 320 and a first conductive layer 310 that are sequentially disposed in a direction proximate to the backplane 100. Each LED die is bonded with a single bonding structure 110 through the respective first conductive layer 310.

The micro LED display panel may be manufactured through the above manufacturing method, and has the same technical effects as those of the manufacturing method. Moreover, in these embodiments, the micro LED die 300 may be of a vertical structure. Compared with a horizontal structure, almost all current in the vertical structure vertically flows through the micro LED die 300, and there is very little current flowing laterally, which is conducive to diffusion of the current and dissipation of heat, and may meet a development trend of high power.

In some embodiments, as shown in FIG. 5, a surface, away from the first conductive layer 310, of each LED die 300 is a light-emitting surface, and each light-emitting surface has a middle region 340a and an edge region 340b surrounding the middle region 340a. At least one depression W is formed in the middle region 340a of each light-emitting surface.

In these embodiments, the at least one depression W is formed in the middle region 340a of the light-emitting surface of the LED die 300. Compared with the case in the related art that the light-emitting surface of the LED die 300 is a plane, an exit angle of light entering the first semiconductor layer of the LED die 300 may be adjusted, so that the light extraction efficiency may be increased. In addition, the at least one depression W in the middle region 340a of the light-emitting surface of the LED die 300 may reduce an equivalent resistance of the middle region 340a of the light-emitting surface, so that the uniformity of current distribution and the conductivity of the LED die with the vertical structure may be improved.

Figure 13:
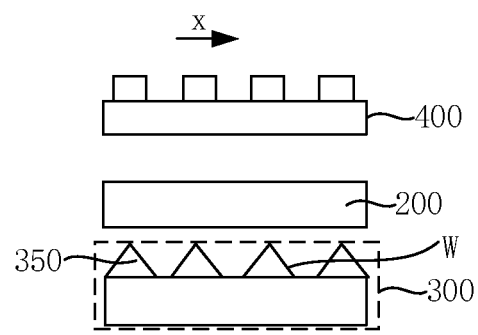
FIG. 13 is a diagram showing a process of forming at least one depression in a surface, away from a backplane, of a first semiconductor layer of a light-emitting diode die through a laser scanning, in accordance with some embodiments of the present disclosure.

In some embodiments, a longitudinal section of each depression W is in a shape of an arc (as shown in FIG. 5), a letter V or an inverted trapezoid (as shown in FIG. 7), and the longitudinal section of each depression W is perpendicular to a plane where the backplane 100 is located. In a case where there are a plurality of depressions W, the plurality of depressions W are sequentially arranged in a first direction (as shown in FIG. 13), where the first direction is parallel to both the plane where the backplane is located and the longitudinal section of each depression W.

In some embodiments, a dimension of each LED die 300 in a second direction (represented by arrows y in FIG. 14) gradually increases in the first direction (represented by arrows x in FIG. 14); alternatively, the dimension of each LED die 300 in the second direction gradually increases firstly and then gradually decreases in the first direction. The second direction is perpendicular to the first direction and parallel to the plane where the backplane 100 is located.

In these embodiments, by making the dimension of each LED die 300 in the direction perpendicular to the laser scanning direction gradually increase in the laser scanning direction, it is advantageous for a large amount of gas generated in the laser lift-off to escape from two sides in the second direction, which avoids the cracking of the LED die 300 due to poor exhaust in the laser scanning process, and thus the yield rate may be improved.

In some embodiments, as shown in FIG. 14, a cross section of each LED die 300 is in a shape of a trapezoid or a circle. A first base and a second base of the trapezoid are sequentially arranged in the first direction.

The solid arrows x in FIG. 14 indicate the laser scanning direction in the laser lift-off, and the dotted arrows in FIG. 14 indicate the exhaust directions.

In some embodiments, as shown in FIG. 14, in a case where the cross section of the LED die 300 is in the shape of the trapezoid, dimensions of the trapezoid satisfy conditions that, b is greater than of 2a, and c is less than b (b>2a, and c<b), where a is a dimension of a first base of the trapezoid, b is a dimension of a second base of the trapezoid, and c is a height of the trapezoid.

In these embodiments, after the cross section of the LED die 300 satisfies the above dimension requirements, the nitrogen generated after the decomposition of gallium nitride may quickly escape the LED die 300 in the laser lift-off process, which may avoid the cracking of the LED die 300 due to the accumulation of nitrogen generated rapidly inside the LED die 300.

In some embodiments, as shown in FIG. 9, a distance h2 from the lowest point of each depression W to a surface, proximate to the backplane, of the first semiconductor layer 340 is within a range of 2 μm to 5 μm, inclusive.

Accordingly, as shown in FIG. 9, a thickness h1 of the first semiconductor layer 340 at an edge position may be within a range of 5 μm to 10 μm, inclusive. That is, a portion of the first semiconductor layer 340 is etched away to form the at least one depression W, and the minimum thickness of the first semiconductor layer 340 at a position corresponding to each depression is within a range of 2 μm to 5 μm, inclusive.

In some embodiments, in a case where a longitudinal section of each depression W is in a shape of an arc, a curvature of the arc is not greater than 0.3.

In some embodiments, as shown in FIG. 9, the display panel further includes an electrode pattern 360. The electrode pattern 360 is located on a side, away from the backplane, of the first semiconductor layer and disposed in an edge region of a light-emitting surface S.

That is, the electrode pattern 360 is disposed in a region of the light-emitting surface where there is no depression.

The electrode pattern 360 may be an annular electrode pattern, so as to cause the middle region 340a of a surface, away from the light-emitting material layer 330, of the first semiconductor layer 340 of the LED die 300 to form a structure concave towards the light-emitting material layer 330, which improves the uniformity of current distribution and the conductivity of the LED die 300 with the vertical structure.

In some embodiments, as shown in FIG. 9, the display panel further includes a second conductive layer 370. The second conductive layer 370 is located on a side, away from the light-emitting material layer 330, of the first semiconductor layer 340 and in direct contact with the first semiconductor layer 340. A surface of the second conductive layer 370 has a shape approximately the same as a shape of the light-emitting surface.

In these embodiments, by providing the second conductive layer 370, the uniformity of current distribution and the conductivity of the vertical structure may be further increased based on the foregoing. Moreover, the current congestion existing in the LED die 300 with the vertical structure may be reduced due to good conductivity of the second conductive layer 370, and the light extraction current efficiency may be increased.

Here, it will be noted that the first conductive layer 310 may be an anode of the LED die 300. In this case, the second conductive layer 370 may be a cathode of the LED die 300, and the electrode pattern 360 may be a cathode pattern.

Both the second conductive layer 370 and the electrode pattern 360 may be made of indium tin oxides (ITO).

An embodiment of a manufacturing method for a micro LED display panel is provided below.

In a first step, a backplane is cleaned, and driving devices 120 are formed on the backplane. Considering an example where the driving devices 120 are thin film transistors (TFTs), a metal molybdenum (Mo) layer with a thickness of about 0.2 μm is deposited on the backplane and patterned to form gate patterns of the TFTs and first signal lines in a same layer as the gate patterns; a gate dielectric of silicon dioxide ($SiO_2$) with a thickness of 0.15 μm is formed; an indium gallium zinc oxide (IGZO) layer with a thickness of 40 nm is formed and patterned to form active patterns; a metal Mo layer with a thickness of about 0.2 μm is deposited and patterned to form sources, drains and second signal lines in a same layer as the sources and the drains; a passivation layer of $SiO_2$ with a thickness of about 0.3 μm is formed; a laminated film layer of titanium (Ti)/aluminum (Al)/Ti is formed and patterned to form pixel electrodes and connection electrodes. A pixel electrode is electrically connected to one of a source and a drain, and a connection electrode is electrically connected to one signal line, transmitting a constant level signal, of a first signal line and a second signal line. The pixel electrodes and the connection electrodes may be directly used as the bonding structures, alternatively, other conductive patterns may be formed on surfaces of the pixel electrodes and the connection electrodes as the bonding structures, so as to be electrically connected to the first conductive layers of the LED dies 300.

In a second step, a base substrate, such as sapphire, is cleaned; a P-type gallium nitride (P-GaN) semiconductor film is formed on the sapphire substrate; an ohmic contact layer such as nickel (Ni)/gold (Au) layer is formed, a thickness of each of Ni and Au is of about 0.005 μm; a light-emitting material film including a multiple quantum well structure is formed; an N-type gallium nitride (N-GaN) semiconductor film is formed; a first conductive film such as a Ti/Au film or a Ti/Al film is deposited, where thicknesses of Ti and Au may be about 0.01 μm and 0.1 μm respectively, and thicknesses of Ti and Al may be about 0.01 μm and 0.1 μm respectively, and electrode structures are formed through a patterning process. In this way, epitaxial layers (including the P-type gallium nitride semiconductor film, the ohmic contact layer, the N-type gallium nitride semiconductor film and the light-emitting material layer) is obtained on the base substrate. Then, the epitaxial layers and the first conductive film are etched through an etching process to obtain a plurality of LED dies 300 arranged in an array.

In a third step, electrodes of LED dies 300, corresponding to positions of bonding structures in the backplane, of the plurality of LED dies 300 arranged in the array are bonded with the bonding structures 110 in the backplane 100 through an eutectic reaction; laser ablation is performed on P-GaN layers of the LED dies 300 bonded on the backplane 100, so as to peel the LED dies 300 from the base substrate. In addition, by controlling parameters of the laser ablation process (references may be made to the content in the above embodiments of the present disclosure), a curved surface is formed in a middle region 340a of a surface, away from the backplane 100, of the P-GaN layer of the LED die 300.

In a fourth step, metal gallium (Ga) residue on the P-GaN layer of the LED die 300 is removed by using air mixed with atomized hydrogen chloride (HCl).

In a fifth step, an electrode is formed on an exposed surface, away from the backplane 100, of the LED die 300. The electrode may be the electrode pattern or the second conductive layer. Thus, the micro LED display panel may be obtained.

By applying the embodiments of the present disclosure, at least the following beneficial effects may be achieved.

1. The plurality of LED dies 300 with a vertical structure arranged in an array may be formed on the base substrate 200, and designated LED dies 300 are directly transferred to a target backplane 100 through a selective lift-off. That is, a single transfer of the designated LED dies is used, and there is no need to use a sticky substrate or a transfer substrate as a transfer layer, which reduces transfer steps and the number of devices to be transferred in coordination, and greatly increases the transfer efficiency and transfer accuracy.

2. It may be possible to achieve the transfer of the LED dies 300 with the vertical structure, which overcomes a defect that only LED dies 300 with a horizontal structure can be transferred in the related art.

3. After the epitaxial layers and the conductive film are etched, a cross section, parallel to the base substrate 200, of the LED die 300 obtained after etching is in a shape of trapezoid or circle. That is, it may be possible to form the structure whose cross section gradually increases in the laser scanning direction. When the LED die 300 is peeled from a side of the base substrate 200 through the laser lift-off process, it may be possible to control an area of the first semiconductor layer 340 ablated by the laser in the laser scanning direction to gradually increase, which may help the large amount of gas generated by the first semiconductor layer 340 in the laser lift-off to escape the LED die 300 quickly, and thus it may be possible to avoid the cracking of the LED die 300 due to the accumulation of the gas generated rapidly inside the LED die 300.

4. By controlling the intensity and the irradiation duration of the laser, it may be possible to form the at least one depression in the middle region of the surface, away from the light-emitting material layer 330, of the first semiconductor layer 340 of the LED die 300, and the at least one depression may increase the uniformity of current distribution and the conductivity of the LED die with the vertical structure. Moreover, by providing the second conductive layer with good conductivity, it may be possible to further increase the uniformity of current distribution and the conductivity of the LED die with the vertical structure, reduce the current congestion existing in the LED die 300 with the vertical structure, and increase the light extraction current efficiency.

5. After the first semiconductor layer 340 of the LED die 300 is peeled from the base substrate 200, the electrode pattern 360 is firstly formed on a side, away from the backplane 100, of the LED die 300, and then the surface, away from the light-emitting material layer 330, of the first semiconductor layer 340 is etched by using the electrode pattern 360 as a mask. In this way, there is no need to form the electrode pattern 360 according to a surface structure of the first semiconductor layer 340, and thus the difficulty of forming the electrode pattern 360 is reduced.

In the description of the present disclosure, it will be understood that orientations or positional relationships indicated by terms "center", "upper", "lower", "front", "back", "left", "right", "vertical", "horizontal", "top", "bottom", "inner", "outer", etc. are based on orientations or positional relationships shown in the accompanying drawings, which are merely to facilitate and simplify the description of the present disclosure, but are not to indicate or imply that the referred devices or elements must have a particular orientation, or must be constructed and operated in a particular orientation. Therefore, they should not be construed as limitations to the present application.

In the description of the specification, the specific features, structures, materials or characteristics may be combined in any one or more embodiments or examples in a suitable manner.

It will be understood that, although various steps in a flowchart of the accompanying figures are shown in sequence as indicated by the arrows, these steps are not necessarily performed in sequence in the order indicated by the arrows. Unless explicitly stated herein, these steps are executed in no strict order, and may be executed in other orders. Moreover, at least a portion of the steps in the flowcharts of the accompanying drawings may include a plurality of sub-steps or phases, and these sub-steps or phases are not necessarily executed at a same time, but may be executed at different times. The order of execution is not necessarily to be performed sequentially, but may be performed alternately or alternately with other steps or at least a portion of the sub-steps or phases of other steps.

The forgoing descriptions are merely some implementations of the present disclosure. It will be pointed out that, a person of ordinary skill in the art may also make numerous improvements and modifications without departing from the principle of the present disclosure, which shall also be considered to be within the protection scope of the present disclosure.

What is claimed is:

1. A manufacturing method for a micro light-emitting diode display panel, the manufacturing method comprising:
providing a base substrate carrying a plurality of light-emitting diode dies, each light-emitting diode die including a first semiconductor layer, a light-emitting material layer, a second semiconductor layer and a first conductive layer that are formed on the base substrate and sequentially arranged in a direction away from the base substrate, wherein the first semiconductor layer is bonded with the base substrate through a sacrificial layer, a material of the sacrificial layer is decomposable under laser irradiation;
providing a backplane having a plurality of bonding structures;
bonding at least some light-emitting diode dies of the plurality of light-emitting diode dies to at least some of the plurality of bonding structures through respective first conductive layers; and peeling each of the at least some light-emitting diode dies from the base substrate through laser lift-off; wherein peeling each of the at least some light-emitting diode dies from the base substrate through the laser lift-off includes: performing laser ablation on the sacrificial layer corresponding to each of the at least some light-emitting diode dies to separate the at least some light-emitting diode dies from the base substrate;

performing the laser ablation on the sacrificial layer corresponding to each of the at least some light-emitting diode dies to separate the at least some light-emitting diode dies from the base substrate includes: covering remaining light-emitting diode dies of the plurality of light-emitting diode dies other than the at least some light-emitting diode dies; and irradiating each of the at least some light-emitting diode dies from a side, away from the plurality of light-emitting diode dies, of the base substrate by using laser with a preset irradiation frequency in a preset ambient atmosphere to decompose the sacrificial layer under irradiation of the laser, so that the at least some light-emitting diode dies are separated from the base substrate; and the manufacturing method further includes:

forming an electrode pattern on a side, away from the backplane, of a first semiconductor layer of each of the at least some light-emitting diode dies, the electrode pattern being formed in an edge region of a light-emitting surface of the light-emitting diode die; and etching a surface, away from a light-emitting material layer, of the first semiconductor layer of the light-emitting diode die by using the electrode pattern as a mask to form at least one depression in a middle region of the surface of the first semiconductor layer of the light-emitting diode die.

2. The manufacturing method according to claim 1, wherein the sacrificial layer includes a part of the first semiconductor layer, and a light-emitting surface of the light-emitting diode die has a middle region and an edge region surrounding the middle region;

while irradiating each of the at least some light-emitting diode dies from the side, away from the plurality of light-emitting diode dies, of the base substrate by using the laser with the preset irradiation frequency in the preset ambient atmosphere to decompose the sacrificial layer under the irradiation of the laser, so that the at least some light-emitting diode dies are separated from the base substrate, the manufacturing method further comprises:

controlling laser energy received by different portions of each of the at least some light-emitting diode dies to form at least one depression in a middle region of a light-emitting surface of each of the at least some light-emitting diode dies.

3. The manufacturing method according to claim 2, wherein irradiating each of the at least some light-emitting diode dies from the side, away from the plurality of light-emitting diode dies, of the base substrate by using the laser with the preset irradiation frequency in the preset ambient atmosphere includes:

scanning each of the at least some light-emitting diode dies in a first direction through a laser scanner in the preset ambient atmosphere, wherein the first direction is parallel to a plane where the backplane is located; and controlling the laser energy received by the different portions of each of the at least some light-emitting diode dies includes:

controlling residence times of the laser generated by the laser scanner at the different portions of each of the at least some light-emitting diode dies or a duty cycle of the laser generated by the laser scanner to control the laser energy received by the different portions of each of the at least some light-emitting diode dies.

4. The manufacturing method according to claim 1, further comprising:

forming a second conductive layer on a side, away from the backplane, of a first semiconductor layer of each of the at least some light-emitting diode dies, a surface of the second conductive layer having a shape same as a shape of a surface of the first semiconductor layer, and the second conductive layer being in direct contact with the first semiconductor layer.

5. The manufacturing method according to claim 1, wherein providing the base substrate carrying the plurality of light-emitting diode dies includes:

forming epitaxial layers on the base substrate through an epitaxial process, the epitaxial layers including a first semiconductor film, a light-emitting film and a second semiconductor film that are sequentially arranged in the direction away from the base substrate, wherein the first semiconductor film is bonded with the base substrate through a sacrificial material layer, a material of the sacrificial material layer is decomposable under the laser irradiation;

forming a conductive film on the second semiconductor film; and dividing an entirety of the epitaxial layers and the conductive film into the plurality of light-emitting diode dies through a patterning process.

6. The manufacturing method according to claim 3, wherein a dimension of each light-emitting diode die in a second direction increases in the first direction; or a dimension of each light-emitting diode die in a second direction increases and then decreases in the first direction;

the second direction is perpendicular to the first direction and parallel to the plane where the backplane is located.

7. The manufacturing method according to claim 1, wherein the preset ambient atmosphere is an air atmosphere with a humidity lower than 5%, the air atmosphere contains hydrogen chloride vapor or hydrogen chloride mist; and/or the preset irradiation frequency is 0.1 Hz to 1 kHz, inclusive.

8. The manufacturing method according to claim 1, further comprising:

cooling the at least some light-emitting diode dies after the laser ablation by using nitrogen with a temperature lower than 25° C.; and removing residues after the laser ablation.

9. A micro light-emitting diode display panel, comprising:

a backplane having a plurality of bonding structures; and a plurality of light-emitting diode dies disposed on the backplane and bonded with at least some bonding structures in the backplane, each light-emitting diode die including a first semiconductor layer, a light-emitting material layer, a second semiconductor layer and a first conductive layer that are sequentially disposed in a direction proximate to the backplane; wherein each light-emitting diode die is bonded with a single bonding structure of the at least some bonding structures through the first conductive layer;

a surface, away from the first conductive layer, of each light-emitting diode die is a light-emitting surface, the light-emitting surface has a middle region and an edge region surrounding the middle region, the middle region has at least one depression formed therein;

a longitudinal section of each depression is in a shape of an arc, a letter V, or an inverted trapezoid, the longitudinal section of each depression is perpendicular to a plane where the backplane is located;

the at least one depression includes one depression; or the at least one depression includes a plurality of depressions sequentially arranged in a first direction, the first direction is parallel to both the plane where the backplane is located and the longitudinal section of each depression;

a dimension of each light-emitting diode die in a second direction increases in the first direction; or a dimension of each light-emitting diode die in a second direction increases and then decreases in the first direction; wherein the second direction is perpendicular to the first direction and parallel to the plane where the backplane is located; and a cross section of each light-emitting diode die is in a shape of a trapezoid or a circle, a first base and a second base of the trapezoid are sequentially arranged in the first direction, and the cross section is parallel to the plane where the backplane is located.

10. The display panel according to claim 9, wherein in a case where the cross section of the light-emitting diode die is in the shape of the trapezoid, dimensions of the trapezoid satisfy conditions that, b is greater than 2a and c is less than b (b>2a, and c<b);

wherein a is a dimension of the first base of the trapezoid, b is a dimension of the second base of the trapezoid, and c is a height of the trapezoid.

11. The display panel according to claim 9, wherein
a distance from a lowest point of each depression to a surface, proximate to the backplane, of the first semiconductor layer is within a range of 2 μm to 5 μm, inclusive.

12. The display panel according to claim 9, wherein
in a case where the longitudinal section of each depression is in the shape of the arc, a curvature of the arc is not greater than 0.3.

13. The display panel according to claim 9, further comprising at least one of:

an electrode pattern located on a side, away from the backplane, of the first semiconductor layer and disposed in an edge region of the light-emitting surface; or a second conductive layer located on a side, away from the light-emitting material layer, of the first semiconductor layer and in direct contact with the first semiconductor layer, a surface of the second conductive layer having a shape same as a shape of the light-emitting surface.

* * * * *